(12) United States Patent
Prall

(10) Patent No.: US 6,998,314 B2
(45) Date of Patent: Feb. 14, 2006

(54) FABRICATING A $2F^2$ MEMORY DEVICE WITH A HORIZONTAL FLOATING GATE

(75) Inventor: Kirk Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/755,990

(22) Filed: Jan. 13, 2004

(65) Prior Publication Data
US 2004/0141359 A1    Jul. 22, 2004

Related U.S. Application Data

(62) Division of application No. 09/802,234, filed on Mar. 8, 2001, now Pat. No. 6,759,707.

(51) Int. Cl.
*H01L 21/336* (2006.01)

(52) U.S. Cl. .................... 438/270; 257/314

(58) Field of Classification Search ............ 438/257, 438/276, 270
See application file for complete search history.

(56) References Cited

U.S. PATENT DOCUMENTS

| | | | |
|---|---|---|---|
| 4,964,080 A | 10/1990 | Tzeng | |
| 5,386,132 A | 1/1995 | Wong | |
| 5,495,441 A | 2/1996 | Hong | |
| 5,877,525 A | 3/1999 | Ahn | |
| 5,936,274 A * | 8/1999 | Forbes et al. | 257/315 |
| 5,969,383 A | 10/1999 | Chang et al. | |
| 5,990,509 A | 11/1999 | Burns, Jr. | |
| 5,998,261 A | 12/1999 | Hofmann et al. | |
| 6,091,105 A | 7/2000 | Gardner et al. | |

FOREIGN PATENT DOCUMENTS

WO    WO 99/43030    8/1999

OTHER PUBLICATIONS

Pein et al.; Fellow, IEEE, Performance of the 3-D PENCIL Flash EPROM Cell and Memory Array, IEEE Transactions on Electronic Devices, Nov. 1995, p. 1982-1991, vol. 42, No. 11.

Nakagawa et al.; A Flash EEPROM Cell with Self-Aligned Trench Transistor & Isolation Structure, ULSI Device Development Laboratory, VLSI Manufacturing Engineering Division, NEC Corporation, p. 1123, Shimokuzawa, Sagamihara, Japan.

* cited by examiner

*Primary Examiner*—W. David Coleman
(74) *Attorney, Agent, or Firm*—Dinsmore & Shohl LLP

(57) ABSTRACT

Methods and devices are disclosed which provide for memory devices having reduced memory cell square feature sizes. Such square feature sizes can permit large memory devices, on the order of a gigabyte or large, to be fabricated on one chip or die. The methods and devices disclosed, along with variations of them, utilize three dimensions as opposed to other memory devices which are fabricated in only two dimensions. Thus, the methods and devices disclosed, along with variations, contains substantially horizontal and vertical components.

35 Claims, 13 Drawing Sheets

FABRICATING A 2F² MEMORY DEVICE WITH A HORIZONTAL FLOATING GATE

CROSS-REFERENCE TO RELATED APPLICATIONS

This application is a division of U.S. patent application Ser. No. 09/802,234, filed Mar. 8, 2001, now U.S. Pat. No. 6,759,707.

BACKGROUND OF THE INVENTION

The present invention relates to the field of semiconductor manufacture and, more particularly, to a 2F² flash memory.

As computers become increasingly complex, the need for improved memory storage increases. At the same time, there is a continuing drive to reduce the size of computers and memory devices. Accordingly, a goal of memory device fabrication is to increase the number of memory cells per unit area.

Memory devices contain blocks or arrays of memory cells. A memory cell stores one bit of information. Bits are commonly represented by the binary digits 0 and 1. A flash memory device is a non-volatile semiconductor memory device in which contents in a single cell or a block of memory cells are electrically programmable and may be read or written in a single operation. Flash memory devices have the characteristics of low power and fast operation making them ideal for portable devices. Flash memory is commonly used in portable devices such as laptop or notebook computers, digital audio players and personal digital assistant (PDA) devices.

In flash memory, a charged floating gate is one logic state, typically represented by the binary digit 1, while a non-charged floating gate is the opposite logic state typically represented by the binary digit 0. Charges are injected or written to a floating gate by any number of methods, including avalanche injection, channel injection, Fowler-Nordheim tunneling, and channel hot electron injection, for example.

A memory cell or flash memory cell may be characterized in terms of its minimum feature size (F) and cell area (F²). For example, a standard NOR flash cell is typically quoted as a ten square feature cell and a standard NAND flash cell is approximately a 4.5 square feature cell. Typical DRAM (dynamic random access memory) cells are between 8 F² and 6 F². Cell area (F²) is determined according to a well known methodology and represents the multiple of the number of features along the x and y dimensions of a memory cell. A suitable illustration of feature size is presented in U.S. Pat. No. 6,043,562, the disclosure of which is incorporated herein by reference.

Memory devices can be created using 2-dimensional structures or using 3-dimensional structures. The 2-dimensional structures are also referred to as planar structures. Generally, 3-dimensional structures yield smaller cell sizes than planar structures. SRAMs and DRAMs have been designed using 3-dimensional structures, however few flash memory cells are fabricated using 3-dimensional structures. Most flash memory cells are fabricated using planar structures. Some flash memory cells have been fabricated using 3-dimensional structures, but they are, generally, in the size range of 4.5 F² to 8 F² which are not significantly smaller than flash memory cells fabricated using planar structures.

Accordingly, there is a need for a 3-dimensional flash memory device having a cell area of reduced square feature size.

SUMMARY OF THE INVENTION

According to one embodiment of the invention, a memory cell is disclosed. The memory cell comprises a source, a vertical channel, a drain and a horizontal floating gate. The vertical channel is formed over the source. The drain is formed over the vertical channel. The horizontal floating gate is formed over at least a portion of the drain.

According to another embodiment of the invention, a memory cell is disclosed. The memory cell comprises a source, a vertical channel, a drain, a horizontal floating gate and a vertical select gate. The vertical channel is formed over the source. The drain is formed over the vertical channel. The horizontal floating gate is formed over at least a portion of the drain. The vertical select gate is formed perpendicular to the horizontal floating gate.

According to yet another embodiment of the invention, a memory cell is disclosed. The memory cell comprises a first transistor and a select transistor. The first transistor comprises a source, a drain and a gate. The select transistor is coupled to the first transistor and comprises a source, a drain and a gate. The gate of the select transistor is formed perpendicular to the gate of the first transistor.

According to yet another embodiment of the present invention, a memory device is disclosed. The memory device includes a first n-type layer, a p-type layer and a second n-type layer. The p-type layer is formed over the first n-type layer. The second n-type layer is formed over the p-type layer forming a vertical channel.

According to yet another embodiment of the invention, a memory device is disclosed. The memory device includes a horizontal first n-type layer, a p-type layer, a horizontal second n-type layer, a horizontal floating gate and a vertical select gate. The horizontal first n-type layer is formed over a substrate. The p-type layer is formed over the first n-type layer. The horizontal second n-type layer is formed over the p-type layer. The horizontal floating gate is formed over the substrate. The vertical select gate is formed over the substrate. The p-type layer formed a vertical channel. The first n-type layer forms a buried source and the second n-type layer forms a drain.

According to yet another embodiment of the invention, a memory device is disclosed. The memory device includes a buried source, a vertical channel, a drain, a floating gate and a select gate. The buried source is formed over a substrate. The vertical channel is formed over the buried source. The drain is formed over the vertical channel. The floating gate is formed over the substrate. The select gate is formed perpendicular to the floating gate in a trench formed in the substrate. The memory device has a square feature size of 2F².

According to yet another embodiment of the invention, a memory device is disclosed. The memory device includes a substrate, a first n-type layer, a p-type layer, a second n-type layer, a floating gate, a trench and a select gate. The substrate has at least one semiconductor layer. The first n-type layer is formed over the substrate. The p-type layer is formed over the first n-type layer. The second n-type layer is formed over the p-type layer. The floating gate is formed over the substrate. The trench is formed in the substrate. The select gate is formed on a sidewall of the trench.

According to yet another embodiment of the invention, a memory device is disclosed. The memory device includes a first n-type layer, a p-type layer, a second n-type layer, a select trench, a vertical select gate, digitlines, a self aligned floating gate and wordlines. The p-type layer is formed over the n-type layer. The second n-type layer is formed in the p-type layer. The select trench is formed in the substrate. The vertical select gate is formed in the select trench. The digitlines are formed over the second n-type layer. The self aligned floating gate is formed over the n-type layer. The wordlines are formed over the substrate and the digitlines.

According to yet another embodiment of the invention, a memory device is disclosed. The memory device includes a first n-type layer, a p-type layer, a second n-type layer, a select trench, a tungsten layer, a spacer, a tunnel oxide layer, a polysilicon layer and an oxide layer. The first n-type layer is formed over a substrate. The p-type layer is formed over the n-type layer. The second n-type layer is formed over the p-type layer. The select trench is formed in the substrate. The vertical select gate is formed in the select trench. The tungsten layer is formed over at least a portion of the second n-type layer. The spacer is formed over the tungsten layer. The tunnel oxide layer is formed over at least a portion of the substrate. The polysilicon layer is formed on the tunnel oxide layer. The oxide layer is formed on the polysilicon layer.

According to yet another embodiment of the invention, a method of fabricating a memory device having a square feature size of $2F^2$ is disclosed. A substrate is provided. A first n-type layer is formed over the substrate. A p-type layer is formed over the first n-type layer. A second n-type layer is formed over the p-type layer. A floating gate is formed over the substrate. A trench is formed in the memory device. A select gate is formed in the trench.

According to yet another embodiment of the invention, a method of fabricating a buried source is disclosed. A wafer is provided having a substrate. A periphery of a wafer is covered using an array mask. Source areas are doped with a dopant. An epitaxial deposition is performed to form a p-type channel.

According to another embodiment of the invention, a method of fabricating a memory device is disclosed. A wafer is provided having a substrate. A buried source is formed over the substrate. A vertical channel is formed over the buried source. A cell implant is performed. A tunnel oxide layer is formed over the substrate. A first poly layer is formed over the tunnel oxide layer. A nitride layer is formed over the first poly layer. Wordlines are patterned into the memory device. STI areas are formed in the memory device. The nitride layer is removed. An oxide nitride oxide layer is formed over a surface of the memory device.

According to yet another embodiment of the invention, a method of fabricating a memory device is disclosed. A wafer is provided having a substrate. A buried source is formed over the substrate. A vertical channel is formed over the buried source. A STI area and a self aligned floating gate is formed. A BPSG layer is deposited over the substrate. A hardmask layer is deposited over the BPSG layer. Active areas are patterned to form an active trench. First spacers are formed along sidewalls of the active trench. A drain is formed in the active trench. A wordline is formed over the drain.

According to another embodiment of the invention, a method of fabricating a memory device is disclosed. A buried source is formed in a substrate. A vertical channel is formed over the buried source. A STI area is formed in the memory device. A self aligned floating gate is formed over the substrate. Wordlines are formed over the substrate. A spacer is formed over the wordlines. Rowlines are formed over the substrate. A select gate is formed in a select trench in the substrate.

The methods and devices disclosed, along with variations of them, provide for memory devices having square feature sizes as small as $2F^2$. Such square feature sizes can permit large memory devices, on the order of a gigabyte or larger, to be fabricated on one chip or die. The methods and devices disclosed, along with variations of them, represent a three dimensional fabrication scheme.

BRIEF DESCRIPTION OF THE SEVERAL VIEWS OF THE DRAWINGS

The following detailed description of the present invention can be best understood when read in conjunction with the accompanying drawings, where like structure is indicated with like reference numerals.

DETAILED DESCRIPTION OF THE INVENTION

Figure 1:
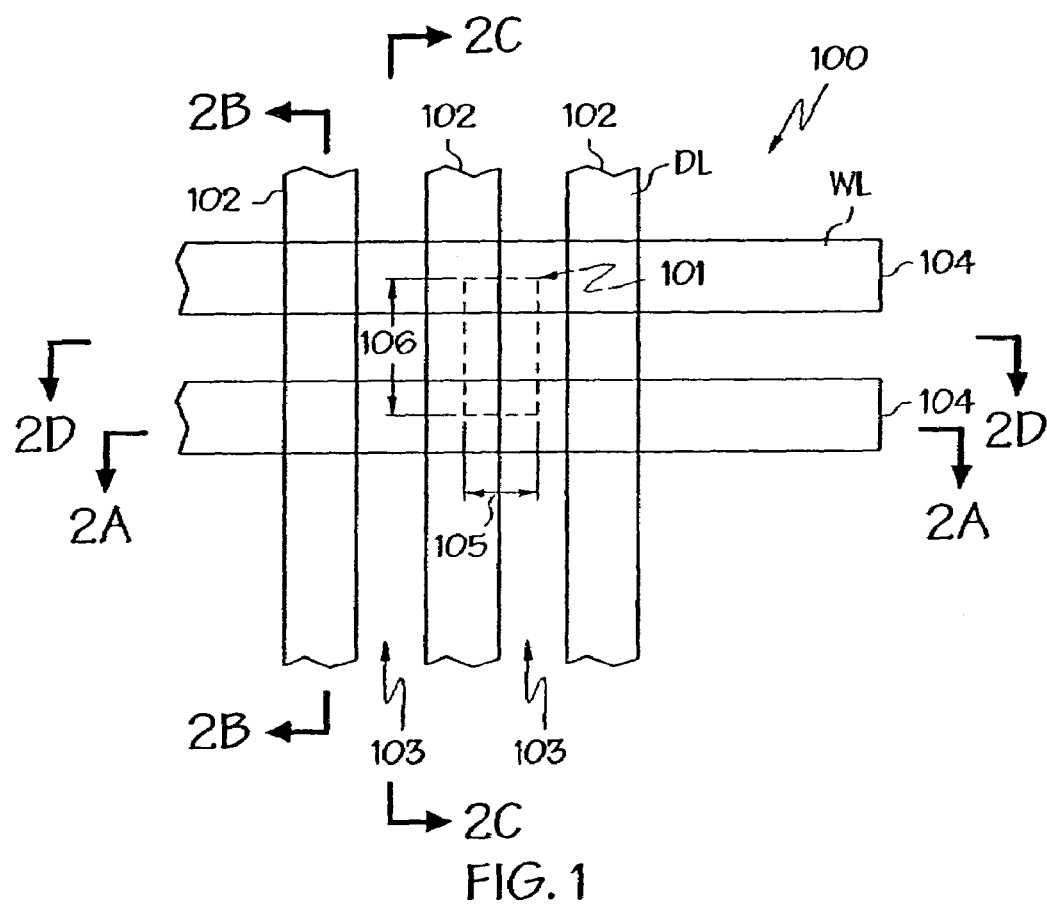
FIG. 1 illustrates a top view layout of a memory device according to one embodiment of the present invention.

FIG. 1 illustrates a top view layout of a memory device 100 according to one embodiment of the present invention. This memory device 100 is generally used for flash memory, but can be used for other types of memory as well. This view illustrates wordlines 104, digitlines 102 and a unit cell or memory cell 101. The unit cell or memory cell 101 is one of many cells of the memory device 100. The memory cell has a minimum feature size of 1F or F 105 in a first dimension which is half of the digitline pitch and a feature size of 2F 106 in a second dimension which is the wordline pitch. The square feature size or feature area of the cell is thus equal to $2F^2$. The memory cells of this memory device 100 are formed using conventional silicon processing technology. As is described in further detail herein with reference to FIGS. 2A, 2B, 2C and 2D, a select transistor having a select gate 205, source 201 and drain 203 is formed as a part of the memory cell 101. The select gate 205 and a floating gate 206 are formed substantially perpendicular to each other. The select gate 205 of the select transistor and the floating gate 206 make up the minimum feature size of the memory cell 101.

Figure 2A:
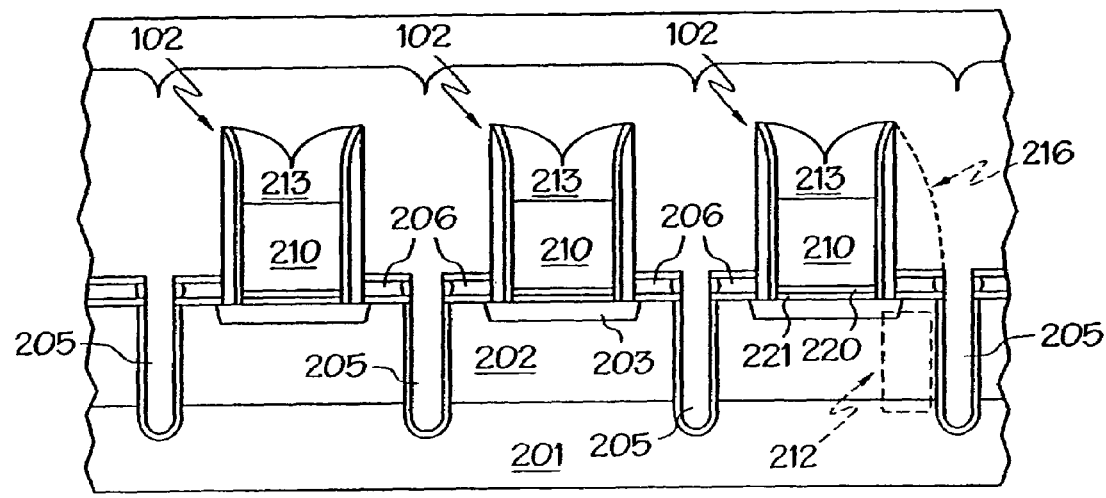
FIG. 2A illustrates a cross section of a memory device according to one embodiment of the present invention with reference to line 2A—2A of FIG. 1.

FIG. 2A illustrates a cross section of the memory device 100 along the 2A—2A line of FIG. 1. An n-type layer 201 is formed over a substrate. This n-type layer 201 operates as a source. A p-type layer 202 is formed over the n-type layer 201. The p-type layer 202 can be formed using epitaxial deposition or any other suitable fabrication scheme. One or more drains 203 are formed in the p-type layer 202. A vertical channel 212 is thus created. A select gate 205 is formed for each pair of memory cells of the memory device 100. The select gate 205 is formed vertically.

Digitlines 102 are formed over at least a portion of the drains 203. The digitlines 102 comprise a tungsten layer 210 and a spacer 213 formed over the tungsten layer 210. Additionally, the digitlines 102 may comprise additional layers such as are described in FIG. 8A. One or more self aligned floating gates 206 are formed horizontally as shown in FIG. 2A and are perpendicular to the select gates 205. The self aligned floating gates 206 can be fabricated any number of ways such as by forming a first oxide layer over a substrate, a poly layer over the first oxide and a second oxide layer over the poly layer. The self aligned floating gates 206 are sub lithographic features and sub lithographic floating gates. Sub lithographic features are generally created using a removable spacer. FIGS. 8A, 8B, 8C and 8D illustrate another example of fabricating the self aligned floating gates 206.

Figure 2B:
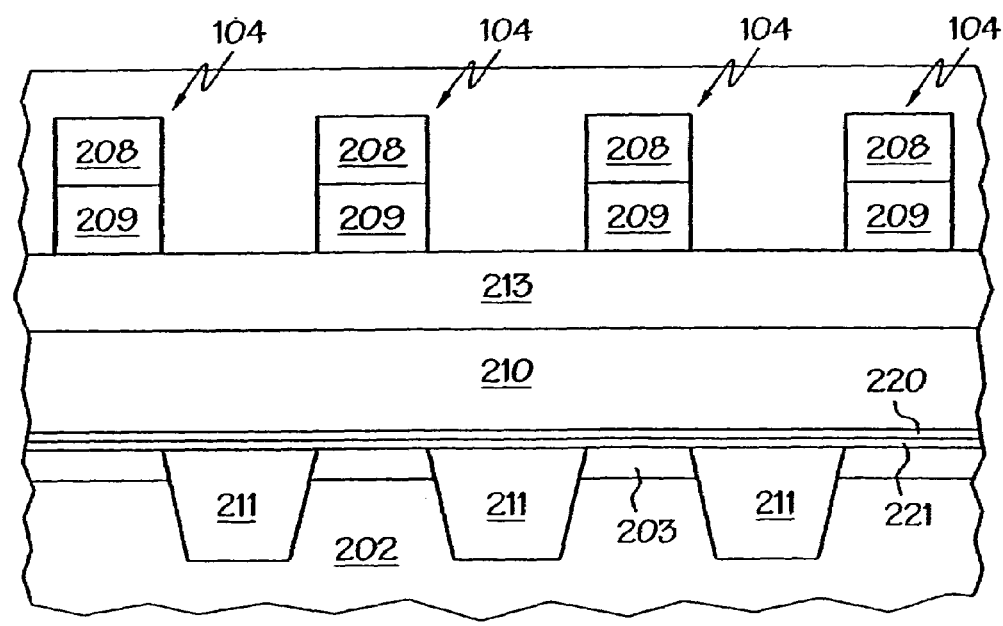
FIG. 2B illustrates a cross section of a memory device according to one embodiment of the present invention with reference to line 2B—2B of FIG. 1.

FIG. 2B illustrates a cross section of the memory device 100 across the 2B—2B line of FIG. 1. One or more wordlines 104, each comprising a second poly layer 209 and a $WSi_x$ layer 208, are formed over the spacers 213. The spacer 213 is formed of a material selected to insulate the wordlines 104 from the digitlines 102. A shallow trench isolation (STI) area 211 has been formed by etching a trench and depositing a trench oxide layer and filling the trench with oxide. A TiSi layer 221 is formed on the STI area 211 and a TiN layer 220 is formed on the TiSi layer 221 below the tungsten layer 210.

Figure 2C:
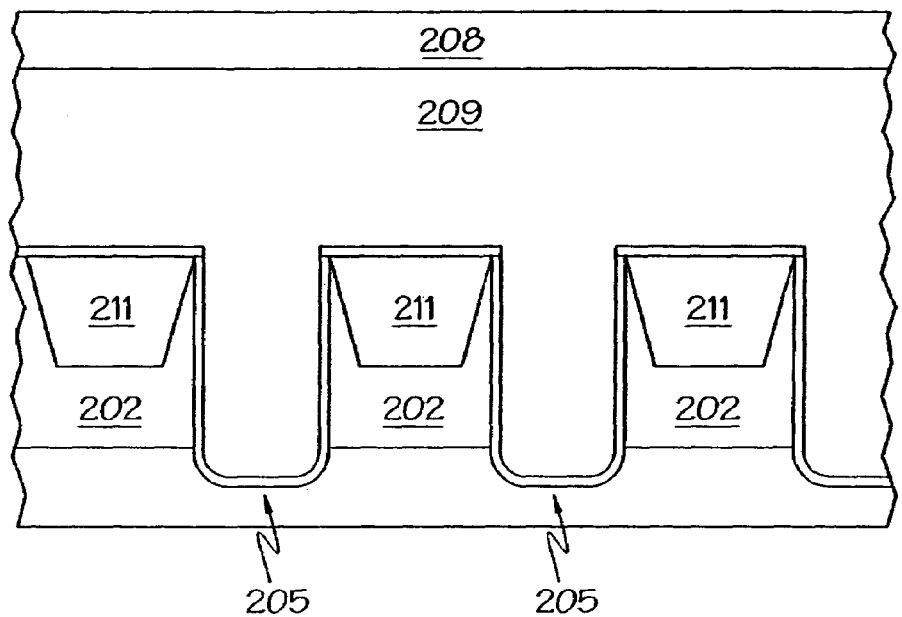
FIG. 2C illustrates a cross section of a memory device according to one embodiment of the present invention with reference to line 2C—2C of FIG. 1.
Figure 2D:
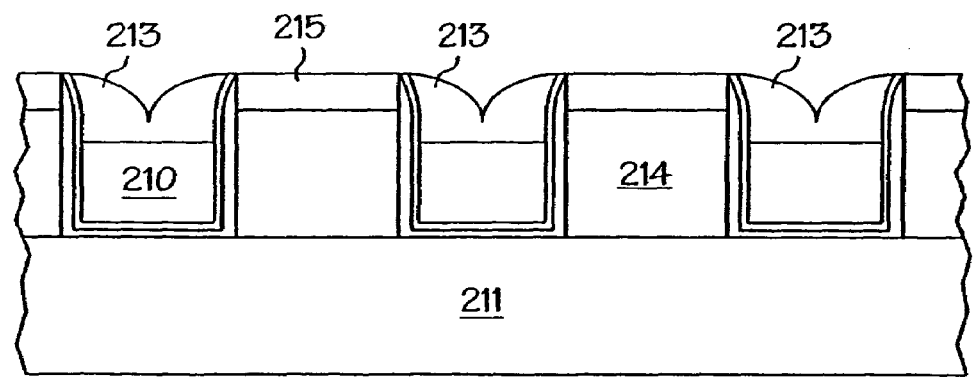
FIG. 2D illustrates a cross section of a memory device according to one embodiment of the present invention with reference to line 2D—2D of FIG. 1.
Figure 3A:
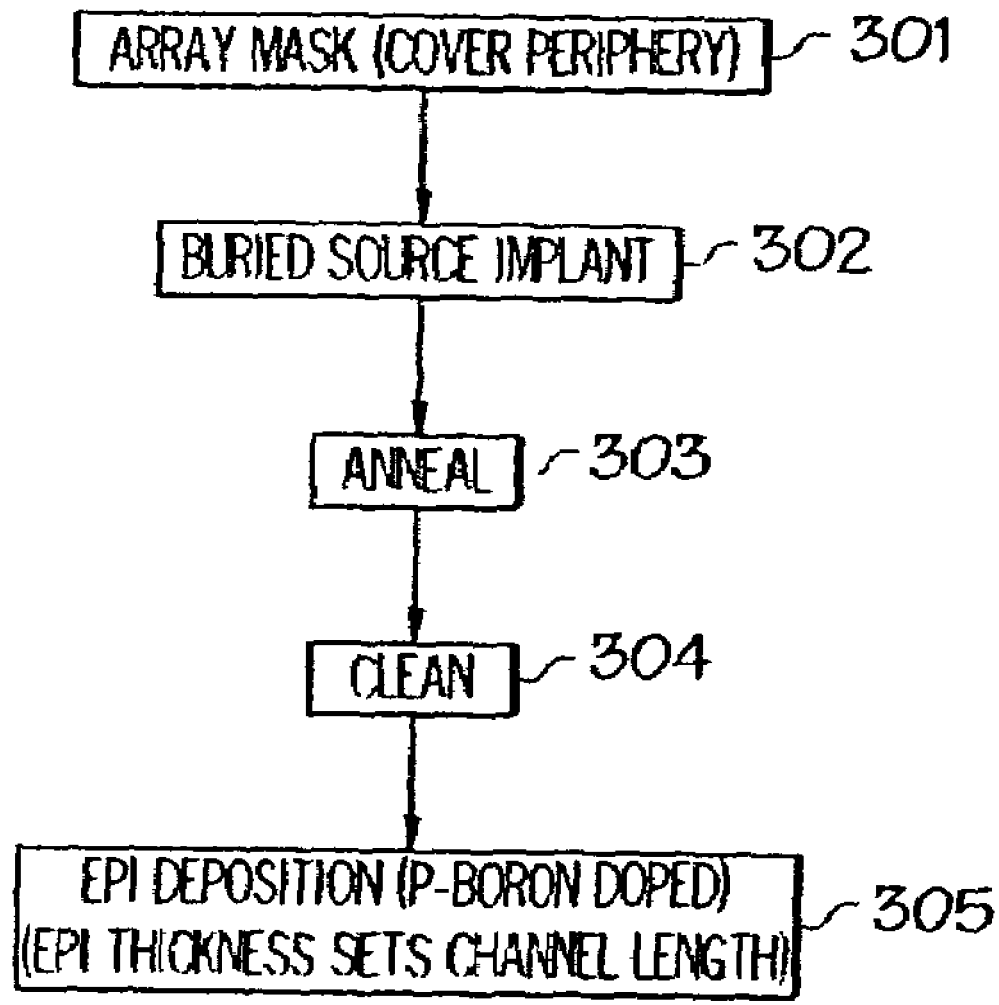
FIGS. 3A–3D illustrates a method of fabricating a memory device according to another embodiment of the present invention.
Figure 3B:
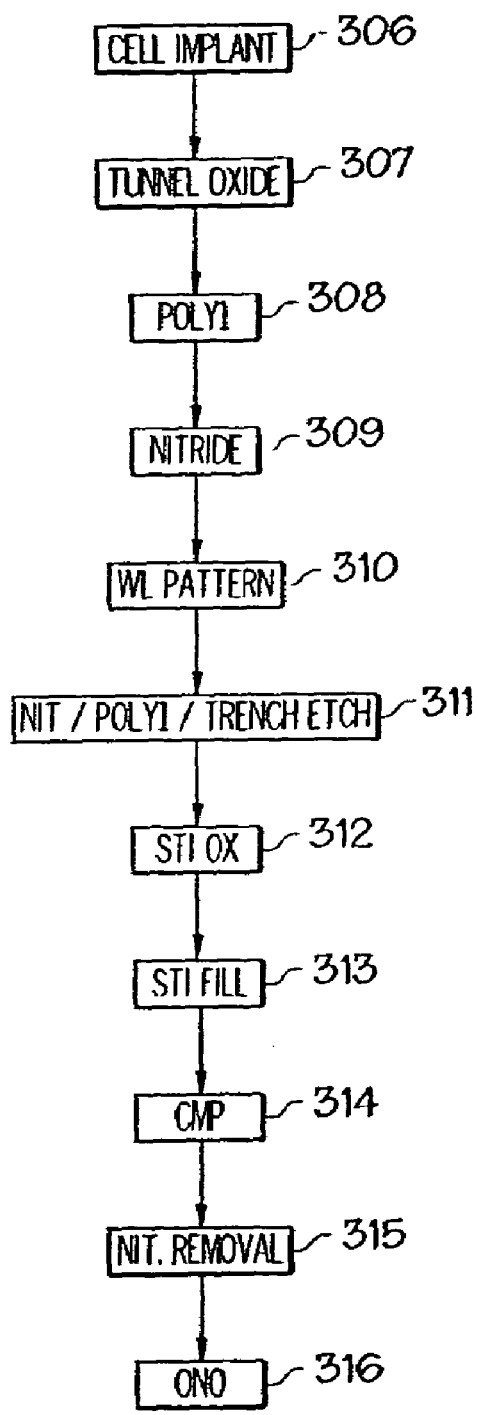
Figure 3C:
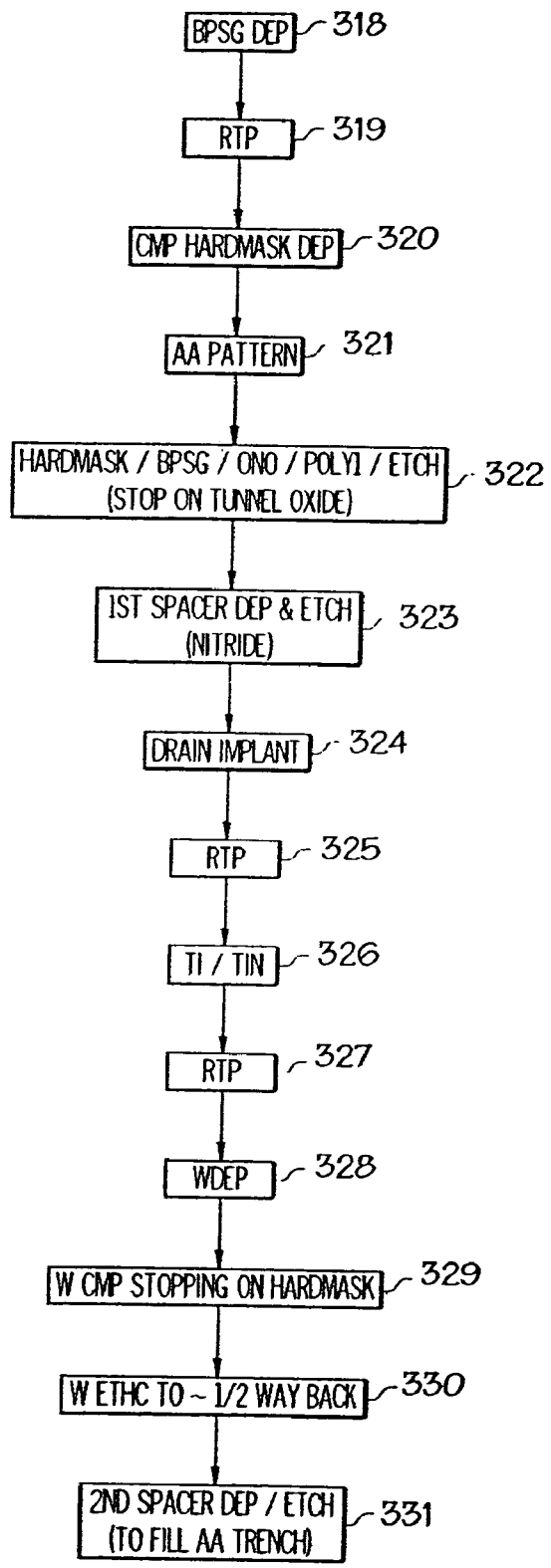
Figure 3D:
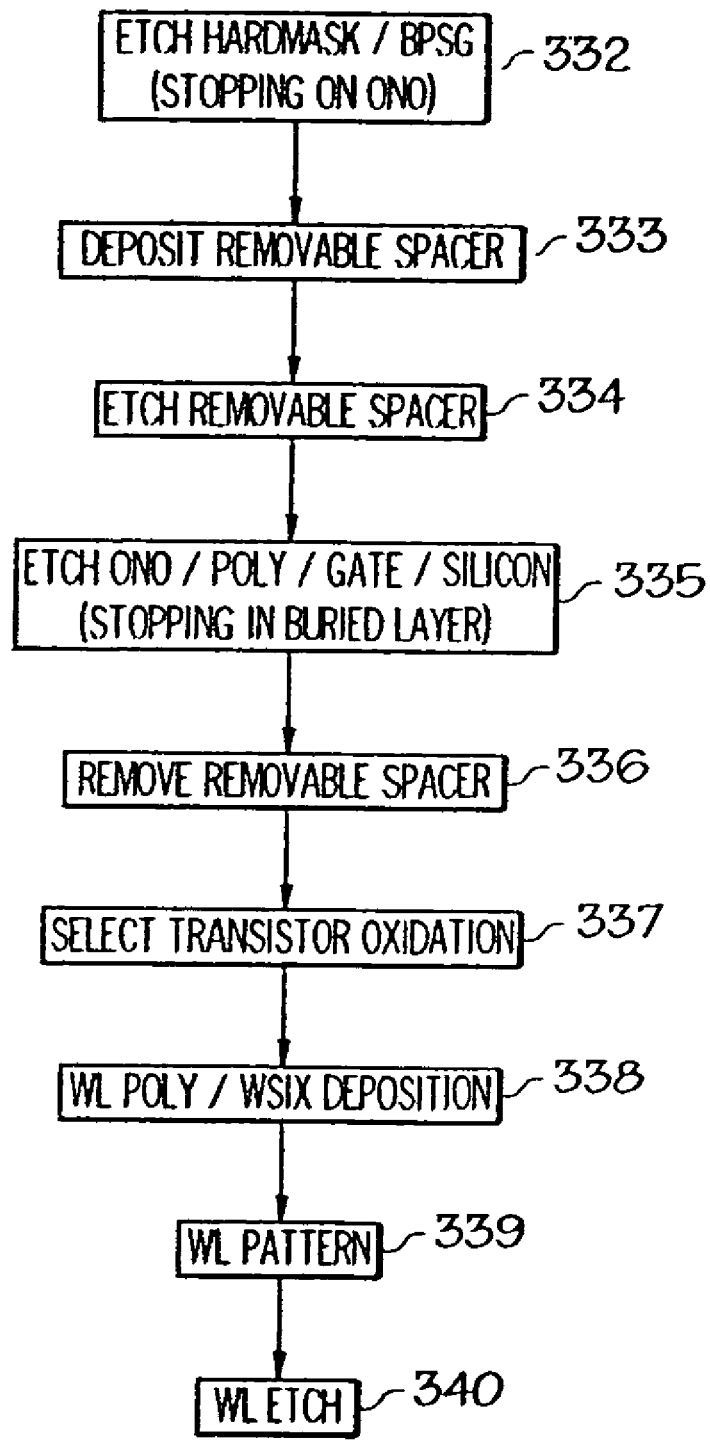

FIG. 2C illustrates a cross section of the memory device 100 across the 2C—2C line of FIG. 1. The vertical select gates 205 are shown. FIG. 2D illustrates a cross section of the memory device 100 across the 2D—2D line of FIG. 1. A boron-doped phosphosilicate glass (BPSG) layer 214 is formed over the STI area 211. A hardmask 215 is formed over the BPSG 214.

The memory device 100 shown in FIGS. 1, 2A, 2B, 2C and 2D constitutes a $2F^2$ memory cell. It is noted that in fabricating the device 100, removable spacers 216, see FIG. 2A, may be provided over the floating gates 206 to allow for sublithography to be possible. The removable spacers 216 are merely illustrated with broken lines because they have been removed. Only one removable spacer 216 is shown to preserve clarity. The placement of the select gate reduces over-erasure. Over-erasure is a condition that commonly occurs in flash memory cells in which Vt is caused to go below 0 which causes a transition and conducts or shorts a column of memory cells to ground. Additionally, programming efficiency is increased due to the floating gate 206 being directly above the vertical channel 212.

Figure 5:
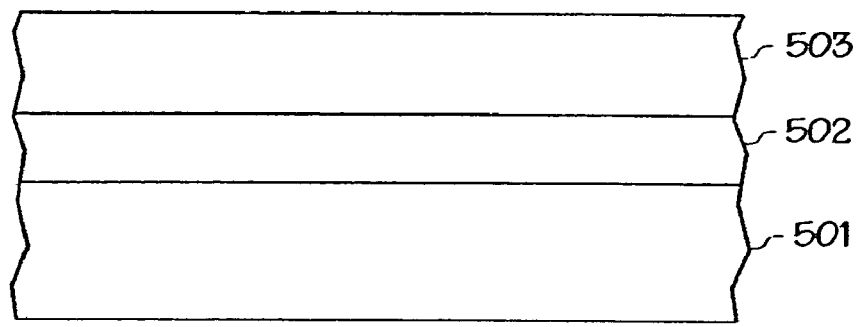
FIG. 5 illustrates a portion of a memory device at a selected stage of processing according to the method of FIG. 3.

FIGS. 3A, 3B, 3C and 3D illustrate a method of fabricating a memory device according to another embodiment of the present invention. An array mask is used to cover a periphery of a wafer at block 301. Buried sources 502, see FIG. 5, are implanted with a dopant at block 302. The dopant used can be As or Sb. An anneal is performed at block 303. The wafer is cleaned at block 304. The wafer can be cleaned using any number of methods such as by using hydrofluoric acid (HF). An epitaxial deposition (EPI) is performed at block 305 to form a p-type channel 503 of a desired thickness, see FIG. 5. The desired thickness sets the channel length. The EPI is performed with a dopant such as boron.

FIG. 5 illustrates a cross section of the memory device at this stage of processing. FIG. 5 shows a p-type substrate 501, buried sources 502 and a p-type channel 503.

Figure 4:
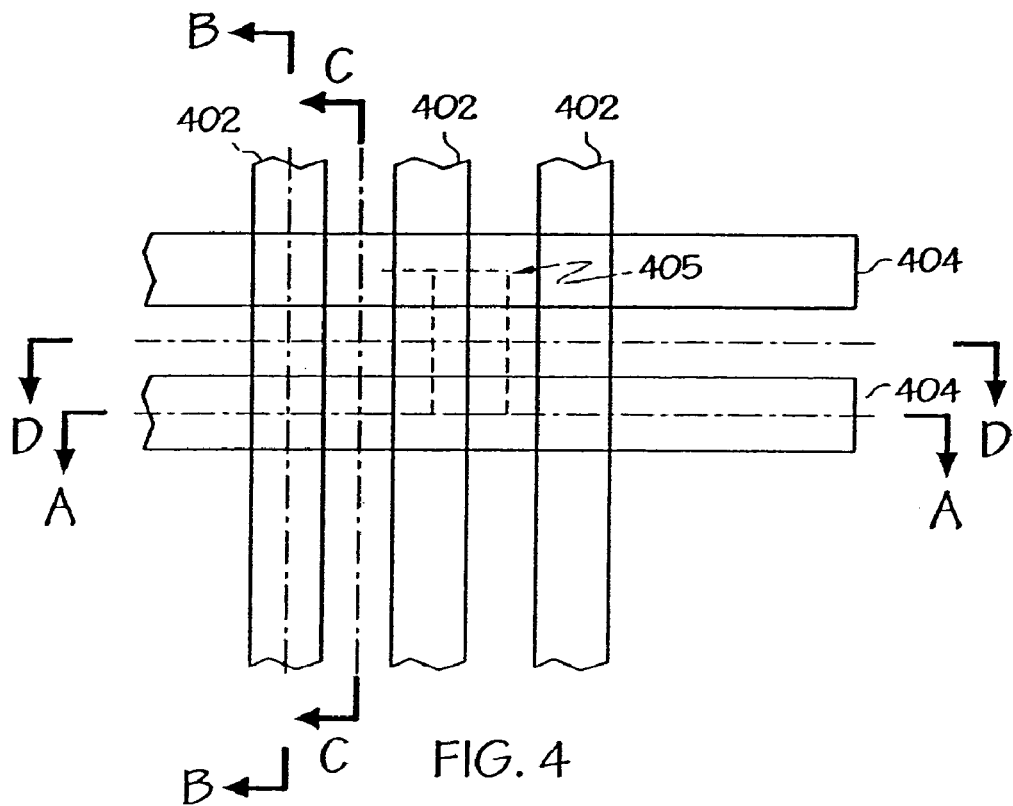
FIG. 4 illustrates a top view of a memory device fabricated according to the method of FIG. 3.

FIG. 4 is a top level view of a memory device fabricated by the method of FIGS. 3A, 3B, 3C and 3D. The view shows a memory cell 405, wordlines 404 and digitlines 402. The view also shows cross sectional lines A—A, B—B, C—C and D—D which are described in further detail below. FIGS. 6A–8D illustrate cross sections of a memory device of the present invention at successive points in the fabrication scheme of the present invention.

Referring to FIGS. 6A, 6B, 6C and 3B, a cell implant is performed at block 306. A tunnel oxide layer 604 is formed over a substrate 608 at block 307. A first poly layer 605 is formed over the tunnel oxide layer 604 at block 308. A nitride layer (not shown) is formed or deposited over the first poly layer 605 at block 309. Areas for the wordlines 404 are patterned into the memory device at block 310. The nitride layer, first poly layer 605 and a trench are etched at block 311 to form STI trenches or areas 607. A shallow trench isolation (STI) oxide layer (not shown) is deposited at block 312. The STI oxide layer rounds out the corners of the trench 607. The STI trench 607 is filled with oxide at block 313. The surface of the memory device is polished or planarized using mechanical planarization at block 314. An exemplary type of mechanical planarization which can be used is a chemical mechanical planarization (CMP). The polishing makes the surface of the memory device planar.

Figure 6A:
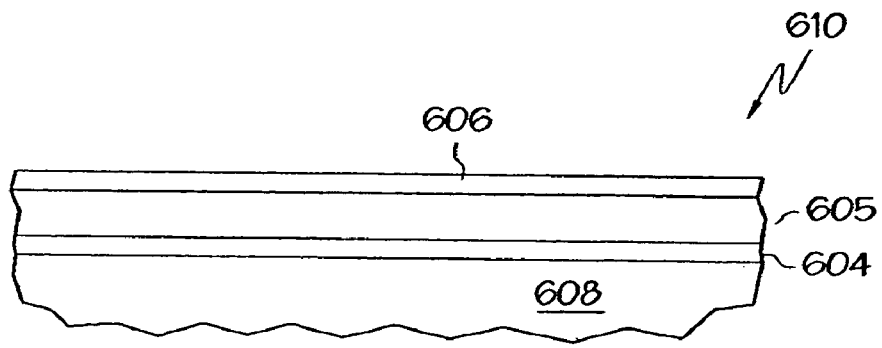
FIG. 6A illustrates a cross section of a memory device at a selected stage of processing according to the method of FIG. 3 with reference to line A—A of FIG. 4.
Figure 6B:
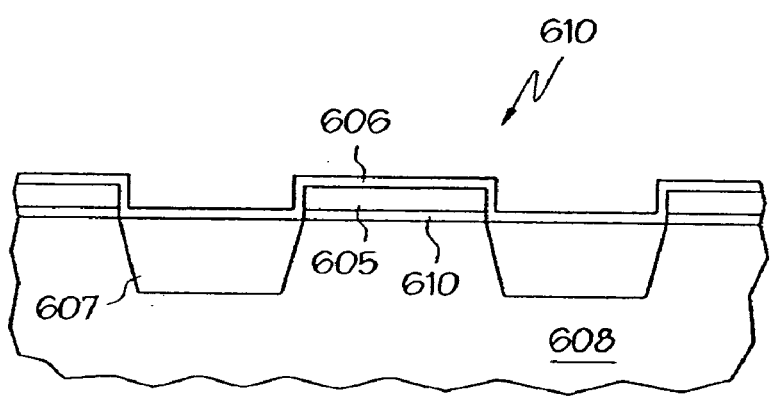
FIG. 6B illustrates a cross section of a memory device at a selected stage of processing according to the method of FIG. 3 with reference to line B—B of FIG. 4.
Figure 6C:
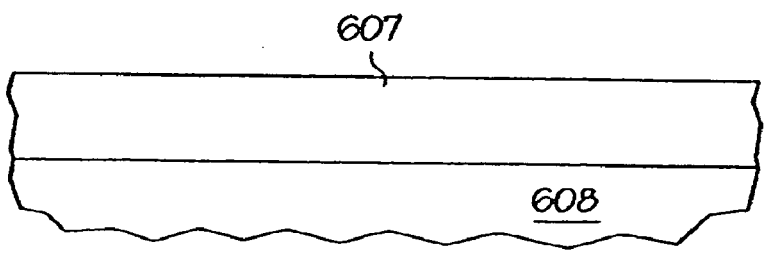
FIG. 6C illustrates a cross section of a memory device at a selected stage of processing according to the method of FIG. 3 with reference to line D—D of FIG. 4.

The nitride layer is removed at block 315. An oxide nitride oxide (ONO) layer 606 is formed over the surface of the memory device at block 316. FIGS. 6A, 6B and 6C show the memory device at this stage of the method and, more particularly, show the floating gate 610 and it's alignment to the STI areas 607. This alignment makes the floating gate 610 a self aligning floating gate.

FIG. 6A illustrates a cross section of the memory device in the process of fabrication with reference to the A—A line of FIG. 4. The tunnel oxide layer 604 is shown formed over the silicon substrate 608. The first poly layer 605 is formed over the tunnel oxide layer 604. The ONO layer 606 is formed over the first poly layer 605. FIG. 6B illustrates a cross section of the memory device in the process of fabrication with reference to the B—B and C—C lines of FIG. 4. This shows how the ONO layer 606 has formed into horizontal and vertical portions. FIG. 6C illustrates a cross section of the memory device in the process of fabrication with reference to the D—D line of FIG. 4 and shows the STI area 607 over the substrate 608.

Referring to FIGS. 3C, 7A, 7B, 7C and 7D, a boron-doped phosphosilicate glass (BPSG) layer 717 is deposited at block 318 over the ONO layer 606. Rapid thermal processing (RTP) is performed on the memory device at block 319. RTP subjects the memory device to a short, controlled thermal cycle. The surface of the memory device is optionally polished by using mechanical planarization again and a hardmask layer 710 is deposited at block 320.

The digitlines or active area 402 of the memory device are patterned at block 321. The digitlines or active area 402 are etched at block 322 down to the tunnel oxide layer 604 to form a trench or active trench 718. The hardmask layer 710, BPSG layer 717, ONO layer 606 and first poly layer 605 of the trench 718 are etched away, but the tunnel oxide layer 604 is not etched. A first spacer layer is deposited and etched at block 323 to vertically form first spacers 711. Drains 714 are formed in the active areas or columns by implanting a dopant at block 324. Another RTP is performed at block 325. TiSi 713 and TiN 712 layers are formed over the drains 714 at block 326. The TiN 712 and TiSi 713 layers are formed horizontally and vertically in the active trench 718. Another RTP is performed at block 327. A tungsten layer 716 is deposited over the active areas or columns in the active trench 718 at block 328. Mechanical planarization is performed on the memory device so that the tungsten layer 716 is planar with the hardmask at block 329. The tungsten layer 716 is etched such that approximately half is removed at block 330. Second spacers 715 are deposited over the tungsten layer 716 at block 331. The second spacers 715 fill the rest of the trench so the height of the active area or columns is approximately equal to the height of the hard mask 710.

Figure 7A:
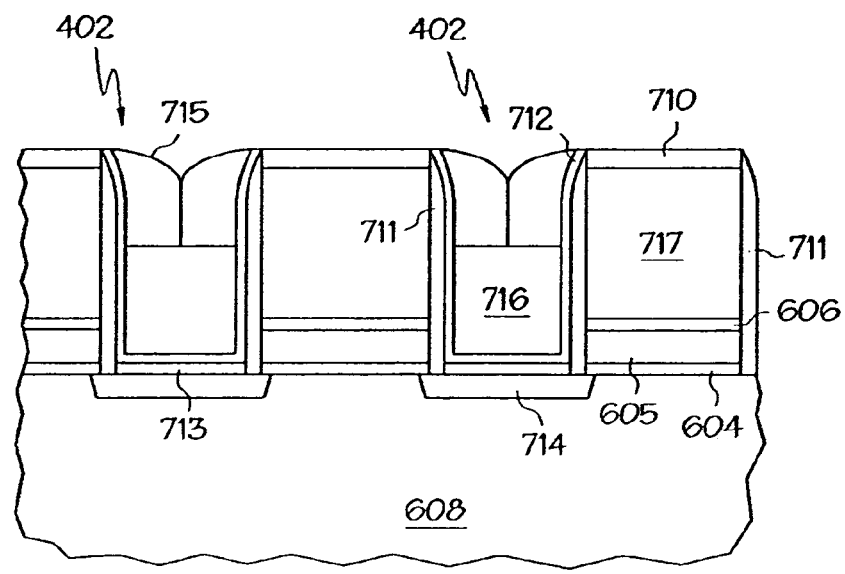
FIG. 7A illustrates a cross section of a memory device at a selected stage of processing according to the method of FIG. 3 with reference to line A—A of FIG. 4.
Figure 7B:
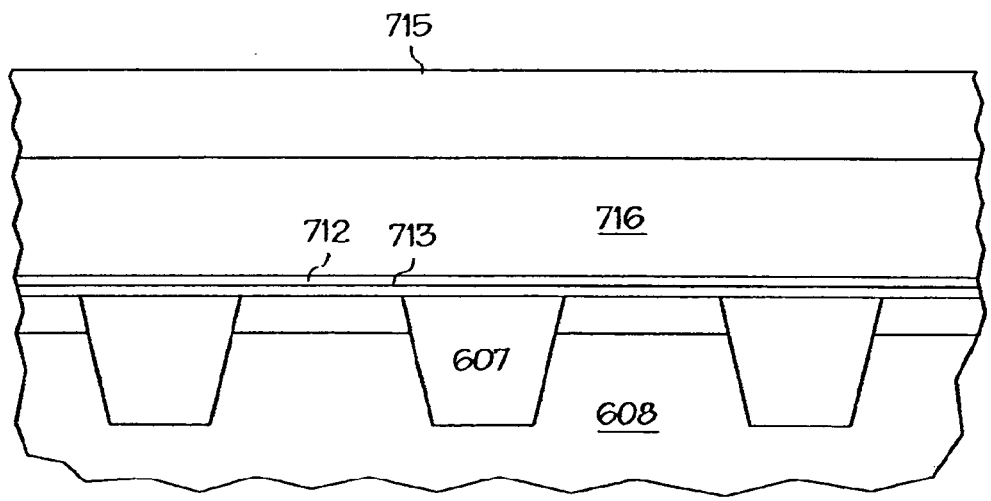
FIG. 7B illustrates a cross section of a memory device at a selected stage of processing according to the method of FIG. 3 with reference to line B—B of FIG. 4.
Figure 7C:
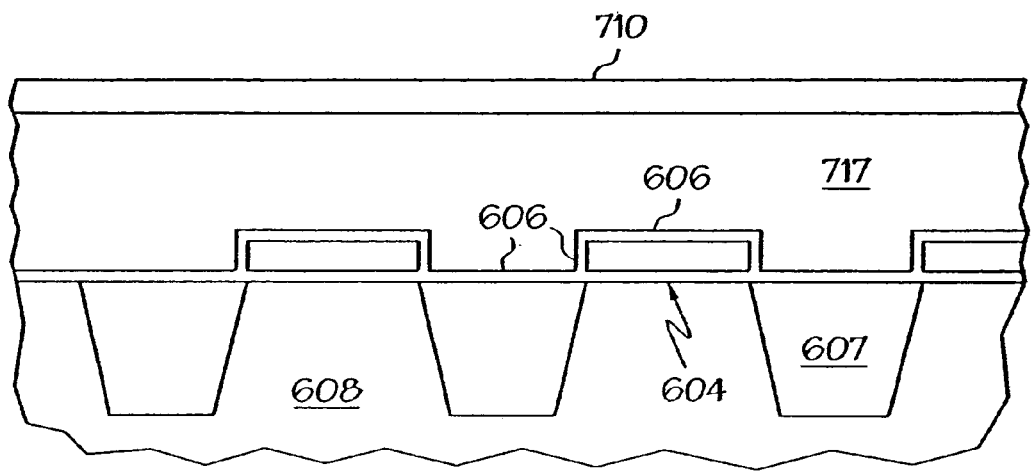
FIG. 7C illustrates a cross section of a memory device at a selected stage of processing according to the method of FIG. 3 with reference to line C—C of FIG. 4.
Figure 7D:
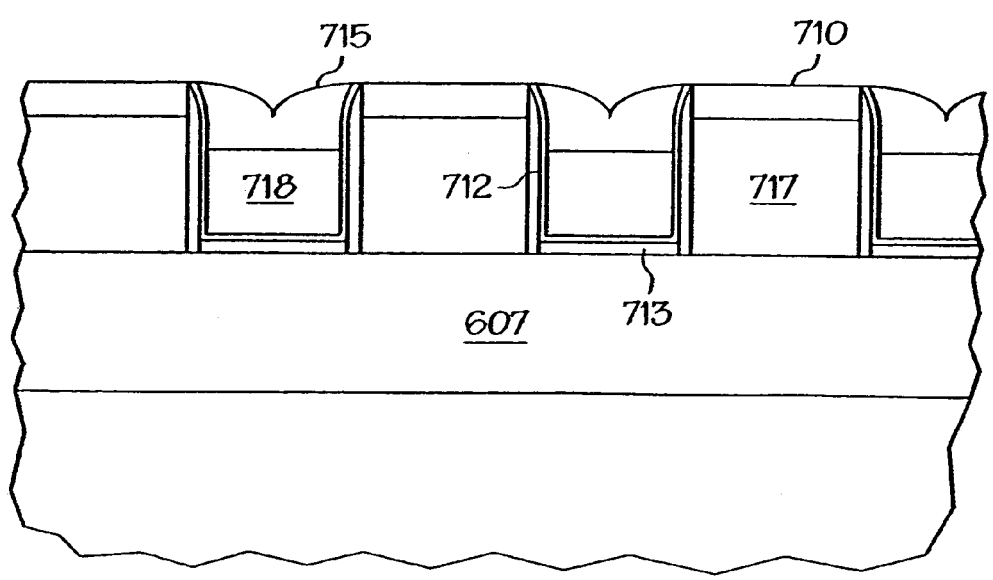
FIG. 7D illustrates a cross section of a memory device at a selected stage of processing according to the method of FIG. 3 with reference to line D—D of FIG. 4.

The digitlines 402 comprise the second spacers 715 and the tungsten layer 716. The digitlines 402 are insulated because of the second spacers 715. FIGS. 7A, 7B, 7C and 7D illustrate the formation of digitlines 402. FIG. 7A shows a cross section of the memory device in the process of fabrication with reference to the A—A line of FIG. 4. The BPSG layer 717 is formed over the ONO layer 606. The hardmask 710 is formed over the BPSG layer 717. The first spacers 711 are formed vertically adjacent to the BPSG layers after the trench 718 has been etched away. The tungsten layer 716 is formed over the Ti layers, TiN 712 and TiSi 713. The second spacers 715 are formed over the tungsten layer 716 in the trench or active areas 718. FIG. 7B shows a cross section of the memory device in the process of fabrication with reference to the B—B line of FIG. 4. FIG. 7C shows a cross section of the memory device in the process of fabrication with reference to the C—C line of FIG. 4. FIG. 7D shows a cross section of the memory device in the process of fabrication with reference to the D—D line of FIG. 4.

Figure 8A:
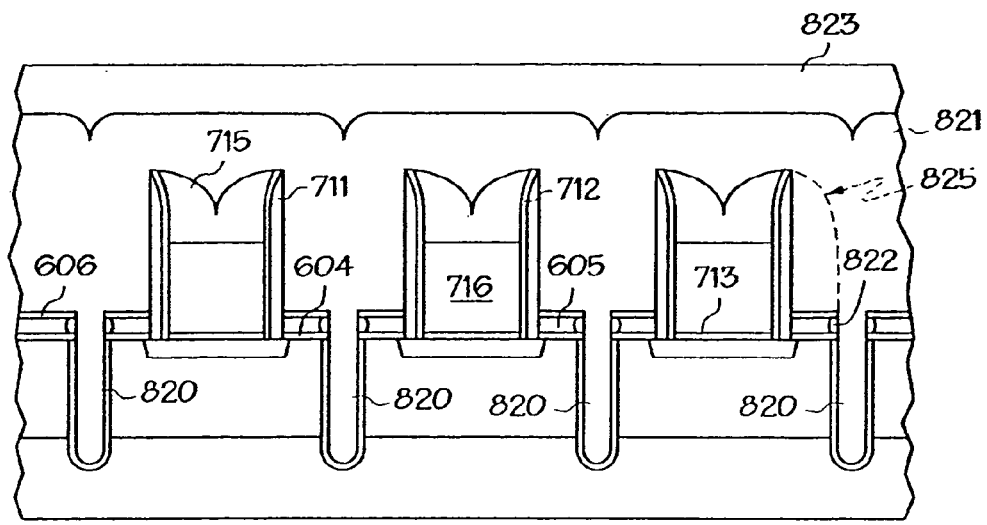
FIG. 8A illustrates a cross section of a memory device at a selected stage of processing according to the method of FIG. 3 with reference to line A—A of FIG. 4.
Figure 8B:
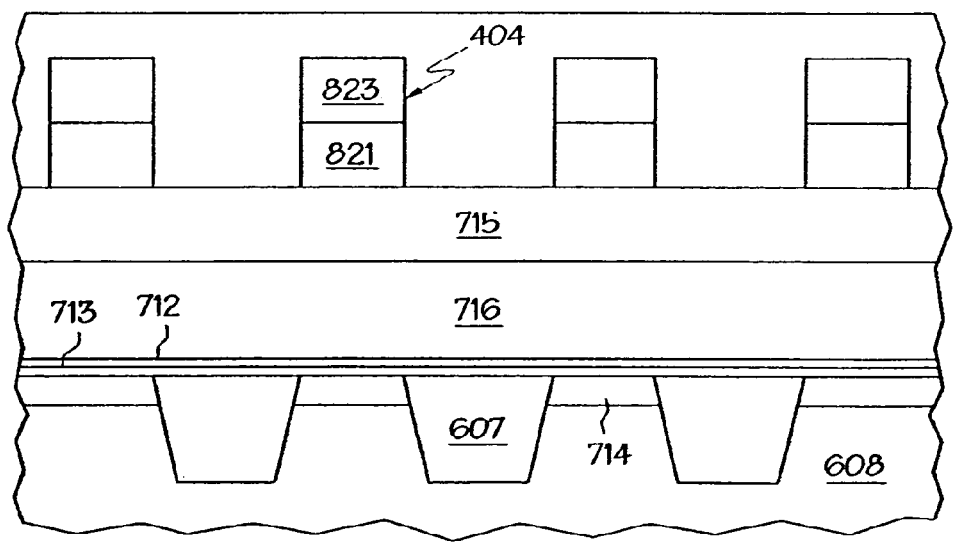
FIG. 8B illustrates a cross section of a memory device at a selected stage of processing according to the method of FIG. 3 with reference to line B—B of FIG. 4.
Figure 8C:
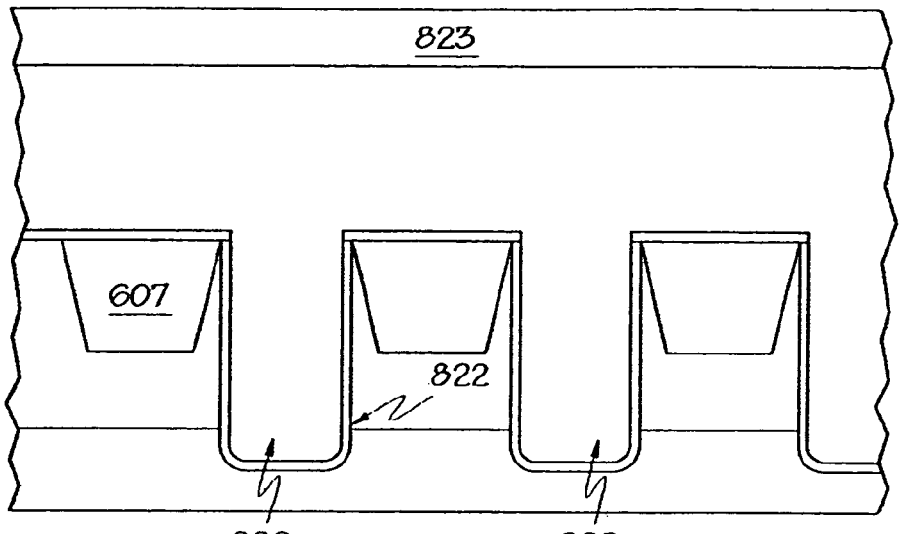
FIG. 8C illustrates a cross section of a memory device at a selected stage of processing according to the method of FIG. 3 with reference to line C—C of FIG. 4.
Figure 8D:
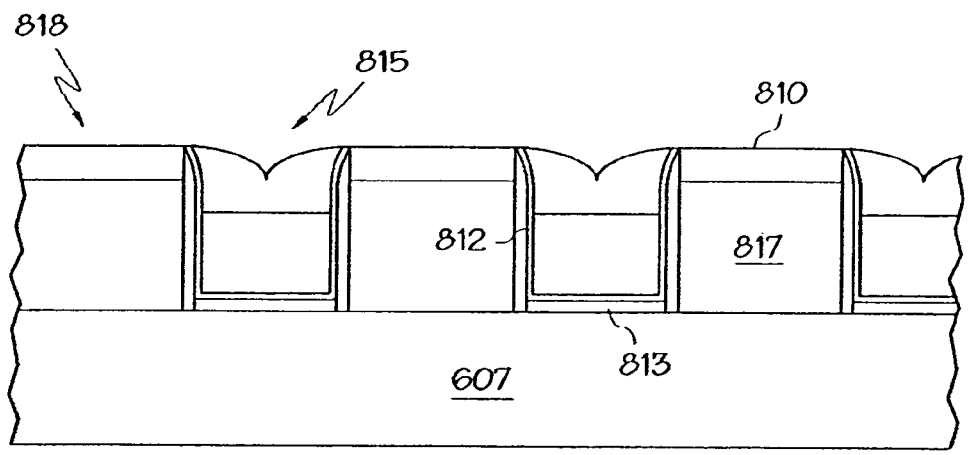
FIG. 8D illustrates a cross section of a memory device at a selected stage of processing according to the method of FIG. 3 with reference to line D—D of FIG. 4.

Referring to FIGS. 3D, 8A, 8B, 8C and 8D, the hardmask layer 710 and BPSG layer 717 are removed or etched from the wordlines 404 at block 332. A removable spacer 825 is deposited at block 333. Only one removable spacer is shown in the figures to preserve clarity. The removable spacer 825 is etched at block 334. At least one select trench 820 is formed by etching the ONO layer 606, first poly layer 605, the tunnel oxide 604 and silicon to a desired depth at block 335. The remaining portion of the removable spacer 825 is removed at block 336. A select transistor oxide layer 822 is formed on the surface of the select trench 820. A second poly layer 821 is formed over the surface of the memory device, including the select trench 820 and a $WSi_x$ layer 823 is deposited over the second poly layer 821 at block 338. The second poly layer 821 is also referred to as the wordline poly. The second poly layer 821 and $WSi_x$ layer 823 are patterned at block 339 and etched at block 340. By etching and removing the removable spacer 825, the second poly layer 821 and floating gate 605 are capacitively coupled. FIGS. 8A, 8B, 8C and 8D show wordline 404 formation. FIG. 8A is a cross section of the memory device in the process of fabrication with reference to the A—A line of FIG. 4. The select trenches 820 have a layer of select gate oxide 822 and are filled with the second poly layer 821. The removable spacer 825 has been removed. The second poly layer 821 is shown in the select trenches 820 and other areas. FIG. 8B is a cross section of the memory device in the process of fabrication with reference to the B—B line of FIG. 4. The wordlines 404 are shown and comprise the $WSi_x$ layer 823 formed over the second poly layer 821 formed over the second spacer 715. Thus, the rowlines 404 are insulated from the tungsten layer 716 by the second spacer 715. FIG. 8C illustrates a cross section of the memory device in the process of fabrication with reference to the C—C line of FIG. 4. The select trenches 820 are shown. FIG. 8D illustrates a cross section of the memory device in the process of fabrication with reference to the D—D line of FIG. 4.

Figure 9:
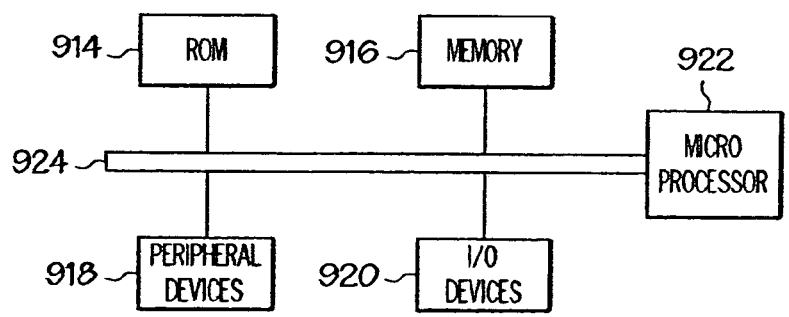
FIG. 9 illustrates a computer system in which embodiments of the present invention may be used.

FIG. 9 is an illustration of a computer system 912 that can use and be used with embodiments of the present invention. The computer system can be a desktop, network server, handheld computer or the like. As will be appreciated by those skilled in the art, the computer system 912 would include ROM 914, mass memory 916, peripheral devices 918, and I/O devices 920 in communication with a microprocessor 922 via a data bus 924 or another suitable data communication path. The memory devices 914 and 916 can be fabricated according to the various embodiments of the present invention, including memory devices having a square feature size of $2F^2$. ROM 914 can include EPROM or EEPROM or flash memory. Mass memory 916 can include DRAM, synchronous RAM or flash memory.

The present inventor recognizes that other 3-dimensional memory cells place the floating gate in the sidewall of a trench in the <111> plane or other planes which have a higher density of bonds. This placement typically results in an inferior oxide resulting in retention, cycling and trapping problems with the memory cell. The present invention generally places the floating gate in the <100> plane thereby avoiding the aforementioned results.

For the purposes of describing and defining the present invention, formation of a material "on" a substrate or layer refers to formation in contact with a surface of the substrate or layer. Formation "over" a substrate or layer refers to formation above or in contact with a surface of the substrate. A "flash memory device" includes a plurality of memory cells. Each "memory cell" of a flash memory device can comprise components such as a gate, floating gate, control gate, wordline, channel region, a source, self aligned source and a drain. The term "patterning" refers to one or more steps that result in the removal of selected portions of layers. The patterning process is also known by the names photo-masking, masking, photolithography and microlithography. The term "self-aligned gate" refers to a memory device where the gate electrodes are formed before the source/drain diffusions are made. An "anneal" is a high temperature processing step designed to minimize stress in the crystal structure of the wafer. An "epitaxial deposition" (EPI) involves depositing a layer of high-quality, single-crystal silicon on a wafer surface to form a base. The term "rapid thermal processing (RTP)" refers to a process that subjects a wafer to a short, yet controlled, thermal cycle which heats the wafer from room temperature to a high temperature, such as 1200° C., in a few seconds.

Many other electronic devices can be fabricated utilizing various embodiments of the present invention. For example, memory devices according to embodiments of the invention can be used in electronic devices such as cell phones, digital cameras, digital video cameras, digital audio players, cable television set top boxes, digital satellite receivers, personal digital assistants and the like. Additionally, large capacity flash memory chips can be fabricated. For example, a $0.45\mu^2$ cell can be realized in $0.15\mu$ technology using a $2F^2$ memory cell.

Having described the invention in detail and by reference to preferred embodiments thereof, it will be apparent that modifications and variations are possible without departing from the scope of the present invention defined in the appended claims. Other suitable materials may be substituted for those specifically recited herein. For example, the substrate may be composed of semiconductors such as gallium arsenide or germanium. Additionally, other dopants may be utilized besides those specifically stated. Generally, dopants are found in groups II and V of the periodic table.

What is claimed is:

1. A method of fabricating a memory device comprising:
   providing a substrate;
   forming a first n-type layer over the substrate;
   forming a p-type layer over the first n-type layer;
   forming a second n-type layer over the p-type layer;
   forming a floating gate over the substrate;
   etching a trench in the p-type layer of said memory device; and
   forming a select gate in the trench, wherein said select gate and said floating gate are substantially perpendicular to each other and wherein said memory device defines a square feature size of $2F^2$.

2. The method of claim 1, wherein forming a first n-type layer over the substrate comprises forming a buried source over the substrate.

3. The method of claim 1, wherein forming a first p-type layer over the first n-type layer comprises forming a first p-type layer over the first n-type layer using epitaxial deposition.

4. The method of claim 1, forming a p-type layer over the first n-type layer comprises forming a vertical channel over the first n-type layer.

5. A method of claim 2, wherein forming a buried source comprising:
   providing a wafer having a substrate;
   covering a periphery of a wafer using an array mask;
   doping source areas with a dopant; and
   performing an epitaxial deposition to form a p-type channel, wherein performing an epitaxial deposition to form a p-type channel comprises performing an epitaxial deposition to form a p-type channel to a determined thickness, wherein the thickness determines a channel length.

6. The method of claim 5, wherein doping source areas with a dopant comprises doping source areas with As.

7. The method of claim 5, wherein doping source areas with a dopant comprises doping source areas with Sb.

8. A method of fabricating a memory device comprising:
   providing a wafer having a substrate;
   forming a buried source in the substrate;
   forming a vertical channel over the buried source;
   performing a cell implant;
   forming a tunnel oxide layer over the substrate;
   forming a first poly layer over the tunnel oxide layer;
   forming a nitride layer over the first poly layer;
   patterning wordlines into the memory device, wherein the memory device defines a square feature size of less than $4F^2$;
   forming STI areas in the memory device;
   removing the nitride layer; and
   forming an oxide nitride oxide layer over a surface of the memory device.

9. The method of claim 8, wherein forming STI areas in the memory device further comprises etching the nitride layer and etching the first poly layer.

10. The method of claim 8, wherein forming STI areas in the memory device further comprises depositing a STI oxide over the STI areas and filling the STI areas with a field oxide.

11. The method of claim 8, further comprising:
    polishing a surface of the memory device using chemical mechanical polishing to make the surface planar.

12. A method of fabricating a memory device comprising:
    providing a wafer having a substrate;
    forming a buried source over the substrate;
    forming a vertical channel over the buried source;
    forming a STI area and a self aligned floating gate;
    depositing a BPSG layer over the substrate;
    depositing a hardmask layer over the BPSG layer;
    patterning active areas to form an active trench;
    forming first spacers along sidewalls of the active trench;
    forming a drain in the active trench; and
    forming a wordline over the drain, wherein said memory device defines a square feature size of less than $4F^2$.

13. The method of claim 12, further comprising performing RTP on the memory device and polishing the surface of the memory device prior to depositing a hardmask layer.

14. The method of claim 12, wherein patterning active areas further comprises etching through the hardmask layer, the BPSG layer, an oxide nitride oxide layer and a first poly layer.

15. The method of claim 12, wherein forming first spacers comprises depositing a first spacer layer and etching the first spacer layer thereby leaving the first spacers along the sidewalls of the active trench.

16. The method of claim 12, further comprising:
    forming a TiN layer over the active trench; and
    forming a TiSi layer over the active trench.

17. The method of claim 12 further comprising:
    performing a RTP on the memory device prior to forming a wordline.

18. The method of claim 12, wherein forming a wordline comprises:
    depositing a wordline layer over the active trench;
    polishing the wordline layer such that the wordline layer is planar to the hardmask layer; and removing a portion of the wordline layer such that a lower portion of the wordline layer remains.

19. The method of claim 18, wherein removing a portion of the wordline layer comprises removing substantially half of the wordline layer.

20. The method of claim 12, further comprising depositing a second spacers over the wordline.

21. A method of fabricating a memory device comprising:
forming active areas in a substrate;
forming a floating gate layer over the substrate;
patterning rowlines in the memory device;
forming a removable spacer over the rowlines; and
etching a select trench in the substrate, wherein said trench and said floating gate layer are substantially perpendicular to each other and wherein the memory cell defines a square feature size of about $2F^2$.

22. The method of claim 21 further comprising:
removing the removable spacer;
forming a select transistor oxide layer over the select trench;
forming a second poly layer over the surface of the memory device;
forming a conductive layer over the second poly layer; and
patterning the second poly layer and the conductive layer.

23. The method of claim 22, wherein forming a conductive layer over the second layer comprises forming a $WSi_x$ layer over the second poly layer.

24. The method of claim 22, wherein forming a second poly layer over the surface of the memory device further comprises forming the second poly layer in the select trench to form a select gate.

25. A method of forming a memory device comprising:
forming a buried source formed in a substrate;
forming a first layer over said substrate;
forming a first drain formed in said first layer so as to define a first substantially vertical channel between said first drain and said buried source;
forming a trench in said first layer;
forming a select gate in said trench; and
forming a horizontal first floating gate over said first layer adjacent to said trench and proximate to said first substantially vertical channel, wherein said first floating gate is dimensioned so as to define a sublithographic gate and the square feature size of the memory cell is not greater than $2F^2$.

26. The method of forming a memory device according to claim 25, further comprising:
forming a second drain formed in the first layer so as to define a second substantially vertical channel between said second drain and said buried source; and
forming a second floating gate over the first layer adjacent to the trench and proximate to the second substantially vertical channel.

27. The method of forming a memory device according to claim 25, wherein the floating gate is formed such that at least a portion of the floating gate overlies at least a portion of the drain.

28. The method of forming a memory device according to claim 25, wherein said trench is formed such that it extends through the first layer to the buried source.

29. The method of claim 25, wherein said formation of said source comprises forming a n-type layer over a substrate.

30. The method of claim 25, wherein said formation of said drain comprises forming a n-type layer over the source.

31. The method of claim 25, wherein said formation of said floating gate layer comprises:
forming a tunnel oxide layer;
forming a polysilicon layer over the tunnel oxide layer; and
forming an oxide layer over the polysilicon layer.

32. The method of claim 25, wherein said formation of said select gate comprises:
forming an oxide layer in the select trench; and
filling the select trench with polysilicon.

33. A method of forming a memory device comprising:
forming a first layer defining a source;
forming a second layer over the first layer;
forming a drain in the second layer so as to define a substantially vertical channel between said source and said drain;
forming a trench in the second layer;
forming a select gate in the trench; and
forming a horizontal floating gate over the second layer adjacent to the trench so as to avoid extending vertically down into the trench below the second layer, wherein the floating gate is dimensioned so as to define a sublithographic gate and the square feature size of the memory cell is not greater than $2F^2$.

34. The method of forming a memory device according to claim 33, wherein the trench is formed so as to extend through the second layer and into the first layer.

35. A computer system comprising at least one processor, a system bus, and a memory device coupled to the system bus, the memory device including at least one memory cell comprising:
a source;
a substantially vertical channel formed over the source;
a drain formed over the vertical channel; and
a substantially horizontal floating gate formed over at least a portion of the drain, wherein the square feature size of the memory cell is not greater than $2F^2$.

* * * * *

UNITED STATES PATENT AND TRADEMARK OFFICE
CERTIFICATE OF CORRECTION

PATENT NO. : 6,998,314 B2 Page 1 of 1
APPLICATION NO. : 10/755990
DATED : February 14, 2006
INVENTOR(S) : Prall, Kirk It is certified that error appears in the above-identified patent and that said Letters Patent is hereby corrected as shown below:

Col. 9, line 37 "II" should read --III--; and

Col 11, line 13-14 "said trench" should read --said select trench--.

Signed and Sealed this

Fifteenth Day of August, 2006

JON W. DUDAS
*Director of the United States Patent and Trademark Office*